United States Patent
Ahn et al.

(10) Patent No.: US 6,756,298 B2
(45) Date of Patent: Jun. 29, 2004

(54) METHODS AND APPARATUS FOR MAKING INTEGRATED-CIRCUIT WIRING FROM COPPER, SILVER, GOLD, AND OTHER METALS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/211,855

(22) Filed: Aug. 1, 2002

(65) Prior Publication Data

US 2002/0197850 A1 Dec. 26, 2002

Related U.S. Application Data

(62) Division of application No. 09/488,098, filed on Jan. 18, 2000, now Pat. No. 6,429,120.

(51) Int. Cl.[7] .................. H01L 21/4763; H01L 21/44
(52) U.S. Cl. .................. 438/635; 438/653; 438/654; 438/685; 438/785
(58) Field of Search ................. 438/653, 654, 438/656, 688, 243, 244, 386, 685, 785, 791, 608, 635; 257/77, 750, 754, 742, 770, 762

(56) References Cited

U.S. PATENT DOCUMENTS

| 2,842,438 | A | 7/1958 | Saarivirta et al. | 75/153 |
|---|---|---|---|---|
| 3,954,570 | A | 5/1976 | Shirk et al. | 204/15 |
| 4,386,116 | A | 5/1983 | Nair et al. | 427/99 |
| 4,394,223 | A | 7/1983 | Hall | 204/15 |
| 4,423,547 | A | 1/1984 | Farrar et al. | 29/571 |
| 4,565,157 | A | 1/1986 | Brors et al. | 118/719 |
| 4,574,095 | A | 3/1986 | Baum et al. | 427/53.1 |
| 4,762,728 | A | 8/1988 | Keyser et al. | 427/38 |

(List continued on next page.)

FOREIGN PATENT DOCUMENTS

| JP | 5-267643 | 10/1993 | H01L/29/46 |
|---|---|---|---|
| JP | 05160826 | 3/1995 | H01L/21/3205 |
| JP | 07078815 | 3/1995 | H01L/21/3205 |
| JP | 07-321111 | 8/1995 | H01L/21/3205 |

OTHER PUBLICATIONS

"Brooks Model 5964 High Performance Metal Seal Mass Flow Controller (Introduced in 1991)", *Brooks Instrument*, http://www.frco.com/brooks/semiconductor/products1i.html,(1991), 1 page.

(List continued on next page.)

*Primary Examiner*—Michael S. Lebentritt
(74) *Attorney, Agent, or Firm*—Schwegman, Lundberg, Woessner & Kluth, P.A.

(57) ABSTRACT

In recent years, copper wiring has emerged as a promising substitute for the aluminum wiring in integrated circuits, because copper offers lower electrical resistance and better reliability at smaller dimensions than aluminum. However, use of copper typically requires forming a diffusion barrier to prevent contamination of other parts of an integrated circuit and forming a seed layer to facilitate copper plating steps. Unfortunately, conventional methods of forming the diffusion barriers and seed layers require use of separate wafer-processing chambers, giving rise to transport delays and the introduction of defect-causing particles. Accordingly, the inventors devised unique wafer-processing chambers and methods of forming barrier and seed layers. One embodiment of the wafer-processing chamber includes equipment for physical vapor deposition and equipment for chemical vapor deposition to facilitate formation of diffusion barriers and seed layers within one chamber, thereby promoting fabrication efficiency and reducing defects.

39 Claims, 3 Drawing Sheets

U.S. PATENT DOCUMENTS

| | | | |
|---|---|---|---|
| 4,788,082 A | 11/1988 | Schmitt | 427/248.1 |
| 4,847,111 A | 7/1989 | Chow et al. | 427/38 |
| 4,931,410 A | 6/1990 | Tokunaga et al. | 437/189 |
| 4,948,459 A | 8/1990 | van Laarhoven et al. | 156/643 |
| 4,962,058 A | 10/1990 | Cronin et al. | 437/187 |
| 4,996,584 A | 2/1991 | Young et al. | 357/71 |
| 5,019,531 A | 5/1991 | Awaya et al. | 437/180 |
| 5,034,799 A | 7/1991 | Tomita et al. | 357/71 |
| 5,084,412 A * | 1/1992 | Nakasaki | 438/656 |
| 5,100,499 A | 3/1992 | Douglas | 156/635 |
| 5,130,274 A | 7/1992 | Harper et al. | 437/195 |
| 5,149,615 A | 9/1992 | Chakravorty et al. | 430/313 |
| 5,158,986 A | 10/1992 | Cha et al. | 521/82 |
| 5,173,442 A | 12/1992 | Carey | 437/173 |
| 5,231,056 A | 7/1993 | Sandhu | 437/200 |
| 5,240,878 A | 8/1993 | Fitzsimmons et al. | 437/187 |
| 5,243,222 A | 9/1993 | Harper et al. | 257/774 |
| 5,256,205 A | 10/1993 | Schmitt, III et al. | 118/723 |
| 5,334,356 A | 8/1994 | Baldwin et al. | 422/133 |
| 5,354,712 A | 10/1994 | Ho et al. | 437/195 |
| 5,371,042 A | 12/1994 | Ong | 437/194 |
| 5,384,284 A | 1/1995 | Doan et al. | 437/190 |
| 5,413,687 A | 5/1995 | Barton et al. | 204/192.14 |
| 5,426,330 A | 6/1995 | Joshi et al. | 257/752 |
| 5,442,237 A | 8/1995 | Hughes et al. | 257/759 |
| 5,447,887 A | 9/1995 | Filipiak et al. | 437/200 |
| 5,470,789 A | 11/1995 | Misawa | 437/190 |
| 5,470,801 A | 11/1995 | Kapoor et al. | 437/238 |
| 5,476,817 A | 12/1995 | Numata | 437/195 |
| 5,495,667 A | 3/1996 | Farnworth et al. | 29/843 |
| 5,506,449 A | 4/1996 | Nakano et al. | 257/758 |
| 5,529,956 A | 6/1996 | Morishita | 437/195 |
| 5,538,922 A | 7/1996 | Cooper et al. | 437/195 |
| 5,539,060 A | 7/1996 | Tsunogae et al. | 525/338 |
| 5,595,937 A | 1/1997 | Mikagi | 437/192 |
| 5,609,721 A | 3/1997 | Tsukune et al. | 156/646.1 |
| 5,625,232 A | 4/1997 | Numata et al. | 257/758 |
| 5,635,253 A | 6/1997 | Canaperi et al. | 427/437 |
| 5,654,245 A | 8/1997 | Allen | 438/629 |
| 5,662,788 A | 9/1997 | Sandhu et al. | 205/87 |
| 5,670,420 A | 9/1997 | Choi | 437/189 |
| 5,674,787 A | 10/1997 | Zhao et al. | 437/230 |
| 5,675,187 A | 10/1997 | Numata et al. | 257/758 |
| 5,679,608 A | 10/1997 | Cheung et al. | 437/195 |
| 5,681,441 A | 10/1997 | Svendsen et al. | 205/114 |
| 5,695,810 A | 12/1997 | Dubin et al. | 427/96 |
| 5,719,089 A | 2/1998 | Cherng et al. | 438/637 |
| 5,719,410 A * | 2/1998 | Suehiro et al. | 257/77 |
| 5,739,579 A | 4/1998 | Chiang et al. | 257/635 |
| 5,763,953 A | 6/1998 | Iljima et al. | 257/762 |
| 5,780,358 A | 7/1998 | Zhou et al. | 438/645 |
| 5,785,570 A | 7/1998 | Bruni | 445/52 |
| 5,792,522 A | 8/1998 | Jin et al. | 427/575 |
| 5,801,098 A | 9/1998 | Fiordalice et al. | 438/653 |
| 5,821,168 A | 10/1998 | Jain | 438/692 |
| 5,824,599 A | 10/1998 | Schacham-Diamond et al. | 438/678 |
| 5,891,797 A | 4/1999 | Farrar | 438/619 |
| 5,891,804 A | 4/1999 | Havemann et al. | 438/674 |
| 5,893,752 A | 4/1999 | Zhang et al. | 438/687 |
| 5,895,740 A | 4/1999 | Chien et al. | 430/313 |
| 5,897,370 A | 4/1999 | Joshi et al. | 438/632 |
| 5,907,772 A | 5/1999 | Iwasaki | 438/253 |
| 5,911,113 A | 6/1999 | Yao et al. | 438/649 |
| 5,913,147 A | 6/1999 | Dubin et al. | 438/687 |
| 5,925,930 A | 7/1999 | Farnworth et al. | 257/737 |
| 5,930,669 A | 7/1999 | Uzoh | 438/627 |
| 5,932,928 A | 8/1999 | Clampitt | 257/758 |
| 5,933,758 A | 8/1999 | Jain | 438/687 |
| 5,948,467 A | 9/1999 | Nguyen et al. | 427/99 |
| 5,962,923 A | 10/1999 | Xu et al. | 257/774 |
| 5,968,333 A | 10/1999 | Nogami et al. | 205/184 |
| 5,969,422 A | 10/1999 | Ting et al. | 257/762 |
| 5,972,179 A | 10/1999 | Chittipeddi et al. | 204/192.17 |
| 5,972,804 A | 10/1999 | Tobin et al. | 438/786 |
| 5,976,710 A | 11/1999 | Sachdev et al. | 428/620 |
| 5,981,350 A | 11/1999 | Geusic et al. | 438/386 |
| 5,985,759 A | 11/1999 | Kim et al. | 438/653 |
| 5,989,623 A | 11/1999 | Chen et al. | 427/97 |
| 5,994,777 A | 11/1999 | Farrar | 257/758 |
| 6,001,730 A | 12/1999 | Farkas et al. | 438/627 |
| 6,008,117 A | 12/1999 | Hong et al. | 438/629 |
| 6,015,465 A | 1/2000 | Kholodenko et al. | 118/719 |
| 6,017,820 A | 1/2000 | Ting et al. | 438/689 |
| 6,030,877 A | 2/2000 | Lee et al. | 438/381 |
| 6,037,248 A | 3/2000 | Ahn | 438/619 |
| 6,054,172 A | 4/2000 | Robinson et al. | 427/97 |
| 6,065,424 A | 5/2000 | Shacham-Diamond et al. | 118/696 |
| 6,069,068 A | 5/2000 | Rathore et al. | 438/628 |
| 6,071,810 A | 6/2000 | Wada et al. | 438/635 |
| 6,100,193 A * | 8/2000 | Suehiro et al. | 438/685 |
| 6,126,989 A | 10/2000 | Robinson et al. | 427/97 |
| 6,136,095 A | 10/2000 | Xu et al. | 118/719 |
| 6,139,699 A | 10/2000 | Chiang et al. | 204/192.15 |
| 6,140,228 A * | 10/2000 | Shan et al. | 438/653 |
| 6,140,234 A | 10/2000 | Uzoh et al. | 438/678 |
| 6,143,646 A | 11/2000 | Wetzel | 438/637 |
| 6,150,261 A | 11/2000 | Hsu et al. | 438/640 |
| 6,153,507 A | 11/2000 | Mikagi | 438/618 |
| 6,159,769 A | 12/2000 | Farnworth et al. | 438/108 |
| 6,168,704 B1 | 1/2001 | Brown et al. | 205/118 |
| 6,171,661 B1 | 1/2001 | Zheng et al. | 427/535 |
| 6,177,350 B1 | 1/2001 | Sundarrajan et al. | 438/688 |
| 6,183,564 B1 | 2/2001 | Reynolds et al. | 118/719 |
| 6,187,656 B1 * | 2/2001 | Lu et al. | 438/592 |
| 6,190,732 B1 | 2/2001 | Omstead et al. | 118/729 |
| 6,197,688 B1 | 3/2001 | Simpson | 438/678 |
| 6,207,222 B1 | 3/2001 | Chen et al. | 427/97 |
| 6,207,553 B1 | 3/2001 | Buynoski et al. | 438/622 |
| 6,207,558 B1 | 3/2001 | Singhvi et al. | 438/648 |
| 6,211,049 B1 | 4/2001 | Farrar | 438/597 |
| 6,211,073 B1 | 4/2001 | Ahn et al. | 438/653 |
| 6,221,763 B1 | 4/2001 | Gilton et al. | 438/643 |
| 6,232,219 B1 | 5/2001 | Blalock et al. | 438/637 |
| 6,249,056 B1 | 6/2001 | Kwon et al. | 257/758 |
| 6,265,311 B1 | 7/2001 | Hautala et al. | 438/680 |
| 6,271,592 B1 | 8/2001 | Kim et al. | 257/751 |
| 6,287,954 B1 | 9/2001 | Ashley et al. | 438/622 |
| 6,323,553 B1 * | 11/2001 | Hsu et al. | 257/751 |
| 6,326,303 B1 | 12/2001 | Robinson et al. | 438/678 |
| 6,359,328 B1 | 3/2002 | Dubin | 257/622 |
| 6,372,622 B1 | 4/2002 | Tan et al. | 438/612 |
| 6,376,370 B1 * | 4/2002 | Farrar | 438/678 |
| 6,387,542 B1 | 5/2002 | Kozlov et al. | 428/673 |
| 6,399,489 B1 | 6/2002 | M'Saad | 438/680 |
| 6,403,481 B1 | 6/2002 | Matsuda et al. | 438/687 |
| 6,518,198 B1 | 2/2003 | Klein | 438/758 |
| 2002/0014646 A1 * | 2/2002 | Tsu et al. | 257/296 |
| 2002/0028552 A1 * | 3/2002 | Lee et al. | 438/243 |
| 2002/0096768 A1 * | 7/2002 | Joshi | 257/750 |
| 2002/0109233 A1 * | 8/2002 | Farrar | 257/762 |

OTHER PUBLICATIONS

Andricacos, P..C., "Copper On–Chip Interconnections", *The Electrochemical Society Interface*, (1999),pp. 32–37.

Anonymous,"Improved Metallurgy for Wiring Very Large Scale Integrated Circuits", *International Technology Disclosures, 4*, Abstract,(1986), 1 page.

Bae, S.., et al.,"Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, (1997),p. 315.

Bernier, M..,et al.,"Laser processing of palladium for selective electroless copper plating", *SPIE, 2045*, (1994),pp. 330–337.

Bhansali, S..,et al.,"A novel technique for fabrication of metallic structures on polymide by selective electroless copper plating using ion implantation", *Thin Solid Films, 270*, No. 1/02, (1995) pp. 489–492.

Bhansali, S..,et al. ,"Selective electroless copper plating on silicon seeded by copper ion implantation", *Thin Solid Films, 253*, (1994),pp. 391–394.

Braud, F..,"Ultra Thin Diffusion Barriers for Cu Interconnections at The Gigabit Generation and Beyond", *VMIC Conference Proceedings*, (1996),pp. 174–179.

Cabrera, A..L.,et al.,"Oxidation protection for a variety of transition metals and copper via surface silicides formed with silane containing atmospheres", *J. Mater. Res., 6(1)*, (1991),pp. 71–79.

De Felipe, T..S.,et al.,"Electrical Stability and Microstructural Evolution in Thin Films of High Conductivity Copper Alloys", *IEEE*, (1999),pp. 293–295.

Ding,"Copper Barrier, Seed Layer and Planerization Technologies", *VMIC Conference Proceedings*, (1997),pp. 87–92.

Dubin, V..M.,et al.,"Selective and Blanket Electroless Copper Deposition for Ultralarge Scale Integration", *J. Electrochem. Soc., 144(3)*, (1997),pp. 898–908.

Dushman, S..,et al., *Scientific Foundations of Vacuum Technique, 2nd Edition*, John Wiley and Sons,(1962),1–806.

Edelstein, D..,"Full Copper Wiring in a Sub–0.25 micrometer CMOS ULSI Technology", *IEDM*, (1997),pp. 773–776.

Eldridge, J..M.,"New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN, (1987),pp. 283–285.

Gladlfelter, W..L.,et al. ,"Trimethylamine Complexes of Alane as Precursors for the Low–Pressure Chemical Vapor Deposition of Aluminum", *Chemistry of Materials, 1*, (1989),pp. 339–343.

Godbey, D..J. ,et al. ,"Copper Diffusion in Organic Polymer Resists and Inter–level Dielectrics", *Thin Solid Films, 308–309*, (1997),pp. 470–474.

Grimblot, J..,et al. ,"II. Oxidation of Aluminum Films", *J. Electrochem., 129*, (1982),pp. 2369–2372.

Hattangady, S..V. ,et al. ,"Integrated processing of silicon oxynitride films by combined plasma and rapid–thermal processing", *J. Vac. Sci. Technol. A, 14(6)*, (1996),pp. 3017–3023.

Hirata, A..,et al.,"WSiN Diffusion Barrier Formed by ECR Plasma Nitridation for Copper Damascene Interconnection", *16th Solid State Devices and Materials*, (1998),pp. 260–261.

Holloway, K..,et al.,"Tantalum as a diffusion barrier between copper and silicon", *Appl. Phys. Lett., 57(17)*, (Oct. 1990), pp. 1736–1738.

Hu, C..K. ,et al. ,"Extendibility of Cu Damascene to 0.1 micrometer Wide Interconnections", *Mat. Res. Soc. Symp. Proc, 514*, (1998),pp. 287–292.

Hymes, S..,et al. ,"Passivation of Copper by Silicide Formation in Dilute Silane", *Conference Proceedings ULSI–VII*, (1992),pp. 425–431.

Iijima, T..,"Microstructure and Electrical Properties of Amorphous W–Si–N Barrier Layer for Cu Interconnections", *1996 VMIC Conference*, (1996) pp 168–173.

Joen, Y..,et al .,"Low–Temperature Fabrication of Polycrystalline Silicon Thin Films by ECR Pecvd", *The Electrochemical Society Proceedings, 94(35)*, (1995),pp. 103–114.

Kamins, T..I.,"Structure and Properties of LPCVD Silicon Films", *J. Electrochem. Soc.: Solid–State Science and Technology, 127*, (Mar. 1980),pp. 686–690.

Keppner, H..,et al. ,"The "Micromorph" Cell: A New Way to High–Efficiency–Low–Temperature Crystalline Silicon Thin–Film Cell Manufacturing", *Mat. Res. Soc. Symp. Proc., 452*, (1997),pp. 865–876.

Kiang, M..,et al. ,"Pd/Si plasma immersion ion implantation for selective electroless copper plating on SiO2", *Appl. Phys. Lett., 60*, (1992),pp. 2767–2769.

Kistiakowsky, G..B. ,et al. ,"Reactions of Nitrogen Atoms. I. Oxygen and Oxides of Nitrogen", *The Journal of Chemical Physics, 27(5)*, (1957),pp. 1141–1149.

Laursen, T..,"Encapsulation of Copper by Nitridation of Cu–Ti Alloy/Bilayer Structures", *International Conference on Metallurgical Coatings and Thin Films*, Abstract No. H1.03, San Diego, CA,(Apr. 1997),p. 309.

Len, V..,et al.,"An investigation into the performance of diffusion barrier materials against copper diffusion using metal–oxide–semiconductor (MOS) capacitor structures", *Solid–State Electronics, 43*, (1999),pp. 1045–1049.

Lyman, T..,et al. ,"Metallography, Structures and Phase Diagrams", *Metals Handbook, 8*, American Society for Metals, Metals Park, Ohio,(1989),pp. 300 & 302.

Marcadal, C..,"OMCVD Copper Process for Dual Damascene Metallization", *VMIC Conference*, ISMIC,(1997),pp. 93–97.

Miller, R..D. ,et al. ,"Low Dielectric Constant Polyimides and Polyimide Nanofoams", *Seventh Meeting of the DuPont Symposium on Polymides in Microelectronics*, (Sep. 1996), pp. 443–473.

Murarka, S..P. ,et al. ,"Copper Interconnection Schemes: Elimination of The Need of Diffusion Barrier/Adhesion Promoter by the Use of Corrosion Resistant, Low Resistivity Doped Copper", *SPIE, 2335*, (1994),pp. 80–90.

Nakao, S..,et al. ,"Thin and Low–Resistivity Tantalum Nitride Diffusion Barrier and Giant–Grain Copper Interconnects for Advanced ULSI Metallization", *Japanese Journal of Applied Physics, 38(4B)*, (Apr. 1999), pp. 262–263.

Newboe, B..,et al. ,"Applied Materials Announces First Barrier/Seed Layer System For Copper Interconnects", *Applied Materials*, http://www.appliedmaterials.com/newsroom/pr–00103.html,(1997),pp. 1–4.

Okamoto, Y..,et al. ,"Magnetically Excited Plasma Oxynitridation of Si at Room Temperature", *Jpn. J. Appl. Phys., 34*, (1995),pp. L955–957.

Radzimski, Z..J. ,et al. ,"Directional Copper Deposition using d–c Magnetron Self–sputtering", *J. Vac. Sci. Technol. B, 16(3)*, (1998),pp. 1102–1106.

Rath, J..K. ,et al.,"Low–Temperature deposition of polycrystalline silicon thin films by hot–wire CVD", *Solar Energy Materials and Solar Cells, 48*, (1997),pp. 269–277.

Ray, S..K. ,et al. ,"Flourine–enhanced nitridation of silicon at low temperatures in a microwave plasma", *J. Appl. Phys., 70(3)*, (1991),pp. 1874–1876.

Rossnagel, S..M. ,et al. ,"Metal ion deposition from ionized mangetron sputtering discharge", *J. Vac. Sci. Technol. B, 12(1)*, (1994),pp. 449–453.

Ryan, J..G. ,"Copper Interconnects for Advanced Logic and DRAM", Extended Abstracts of the 1998 International Conference on Solid–State Devices and Materials, Hiroshima, (1998),pp. 258–259.

Ryu, C..,et al.,"Barriers for copper interconnections", *Solid State Technology*, (Apr. 1999),pp. 53,54,56.

Saarivirta, M..J. ,"High Conductivity Copper Rich Cu–Zr Alloys", *Transactions of the Metallurgical Society of AIME, 218*, (1960),pp. 431–437.

Senzaki, Y..,"Chemical Vapor Deposition of Copper using a New Liquid Precursor with Improved Thermal Stability", *Conference Proceedings ULSI XIII, Materials Research Society*, (1998),pp. 451–455.

Shacham–Diamond, Yosi.,et al.,"Copper electroless deposition technology for ultra–large–scale–integration (ULSI) metallization", *Microelectronic Engineering*, NL, vol. 33, No. 1, XP004054497, (1997),47–58.

Stroud, P..T.,et al.,"Preferential deposition of silver induced by low energy gold ion implantation", *Thin Solid Films*, Switzerland, vol. 9, No. 2, XP000993098, (Feb. 1972), 273–281.

Tsukada, T..,et al.,"Adhesion of copper films on ABS polymers deposited in an internal magnet magnetron sputtering system", *J. Vac. Sci. Technol., 16(2)*, (1979),348–351.

Venkatesan, S..,"A High Performance 1.8V, 0.20 micrometer CMOS Technology with Copper Metallization", *IEEE*, (1997),pp. 769–772.

Vossen, J..L.,et al. , *Thin Film Processes II*, Academic Press, Inc., (1991),1–866.

Wang, K..,et al.,"Very Low Temperature Deposition of Polycrystalline Silicon Films with Micro–Meter–Order Grains on SiO2", *Mat. Res. Soc. Symp. Proc., 355*, (1995),pp. 581–586.

Winters, H..F.,et al.,"Influence of Surface Absorption Characteristics on Reactivity Sputtered Films Grown in the Biased and Unbiased Modes", *J. Appl. Phys., 43(3)*, (1972), pp. 794–799.

Yeh, J..L.,et al. ,"Selective Copper plating of Polysilicon Surface Micromachined Structures", *Solid–State Sensor and Actuator Workshop*, (1998),pp. 248–251.

Zhang, J..,et al. ,"Investigations of photo–induced decomposition of palladium acetate for electroless copper plating", *Thin Solid Films, 318*, (1998), pp. 234–238.

*In: Metals Handbook, Ninth Edition, vol. 2*, Properties and Selection: Nonferrus Alloys and Pure Metals, ASM Handbook Commitee, (eds.), American Society for Metals, Metals Park, OH,(1989), pp. 157, 395.

*In: Kirk–Othmer Concise Encyclopedia of Chemical Technology*, Grayson, M., (ed.), John Wiley & Sons, Inc., New York, NY,(1985), pp. 433–435, 926–938.

*In:Metals Handbook, 8th Edition, vol. 8*, ASM Handbook Commitee, (eds.), American Society for Metals, Materials Park, OH, pp. 300–302.

Abe, K., et al., "Sub–half Micron Copper Interconnects Using Reflow of Sputtered Copper Films", *VLSI Multilevel Interconnection Conference*, (Jun. 25–27, 1995), pp. 308–311.

Anonymous, "Formation of Conductors at Variable Depths — Using Differential Photomask, Projecting Images into Insulator by Reactive Ion Etching, Selectively Filling Images with Conductor", *Research Disclosure*, Disclosure No. RD 291015, Abstract, (Jul. 10, 1988), 1 page.

Bai, G., et al., "Copper Interconnection Deposition Techniques and Integration", *1996 Symposium on VLSI Technology*, Digest of Technical Papers,(1996), pp. 48–49.

Chakravorty, K. K., et al., "High–Density Interconnection Using Photosensitive Polyimide and Electroplated Copper Conductor Lines", *IEEE Transactions on Components, Hybrids, and Manufacturing Technology, 13(1)*, (Mar. 1990), pp. 200–206.

Craig, J. D., "Polymide Coatings", *In: Packaging, Electronic Materials Handbook, vol. 1*, ASM International Handbook Commitee (eds.), ASM International, Materials Park, OH,(1989), pp. 767–772.

Eisenbraun, E. T., et al., "Selective and Blanket Low–Temperature Copper CVD for Multilevel Metallization in ULSI ", *Conference Proceedings ULSI–VII*, (1992), 5 pages.

Ernst, et al., "Growth Model for Metal Films on Oxide Surface: Cu on ZnO(0001)–O", *Physical Review B, 47*, (May 15, 1993), pp. 13782–13796.

Fukuda, T., et al., "0.5 –micrometer–Pitch Copper–Dual Damascene Metallization Using Organic SOG (k=2.9) for 0.18 –micrometer CMOS Applications", *IEEE*, (1999), pp. 619–622.

Hirao, S., et al., "A Novel Copper Reflow Process Using Dual Wetting Layers", *Symposium on VLSI Technology*, Digest of Technical Papers,(1997),57–58.

Izaki, M., et al., "Characterization of Transparent Zinc Oxide Films Prepared by Electrochemical Reaction", *Journal of the Electrochemical Society, 144*, (Jun. 1997), pp. 1949–1952.

Jayaraj, K., et al., "Low Dielectric Constant Microcellular Foams", *Proceedings from the Seventh Meeting of the DuPont Symposium on Polymides in Microelectrics*, (Sep. 1996), pp. 474–501.

Jin, C., et al., "Porous Xerogel Films as Ultra–low Permittivity Dielectrics for ULSI Interconnect Applications", *Conference Proceedings ULSI XII –1997 Materials Research Society*, (1997), pp. 463–469.

Kaloyeros, A. E., et al., "Blanket and Selective Copper CVD from Cu(FOD)2 for Multilevel Metallization", *Mat. Res. Soc. Symp. Proc.*, vol. 181,(1990), 6 pages.

Kang, H. K., et al., "Grain Structure and Electromigration Properties of CVD CU Metallization", *Proceedings of the 10th International VLSI Multilevel Interconnection Conference*, (Jun. 8–9, 1993), pp. 223–229.

Klaus, J. W., "Atomic Layer Deposition of Tungsten Nitride Films Using Sequential Surface Reactions", *Journal of the Electrochemical Society*, 147(3),(2000), pp. 1175–1181.

Min, Jae–Sik, et al., "Metal–Organic Atomic–Layer Deposition of Titanium–Silicon–Nitride Films", *Applied Physics Letters*, vol. 75, No. 11,(1999), pp. 1521–1523.

Miyake, T., et al., "Atomic Hydrogen Enhanced Reflow of Copper", *Applied Physics Letters, 70*, (1997), pp. 1239–1241.

Palleau, J., et al., "Refractory Metal Encapsulation in Copper Wiring", *Advanced Metallization for Devices and Circuits–Science, Technology and Manufacturability, Materials Research Society Symposium Proceedings, 337*, (Apr. 1994), pp. 225–231.

Park, C. W., et al., "Activation Energy for Electromigration in Cu Films", *Applied Physics Letters, 59(*, (Jul. 6, 1991), pp. 175–177.

Ramos, T, et al., "Nanoporous Silica for Dielectric Constant Less Than 2", *Conference Proceedings ULSI XII –1997 Materials Research Society*, (1997), pp. 455–461.

Rossnagel, S. M., "Magnetron Sputter Deposition of Interconnect Applications", *Conference Proceedings, ULSI XI*, (1996), pp. 227–232.

Shacham–Diamand, Y., "100 nm Wide Copper Lines Made by Selective Electroless Deposition", *Journal of Micromechanics and Microengineering, 1*, (Mar. 1991), pp. 66–72.

Srivatsa, A. R., et al., "Jet Vapor Deposition: an Alternative to Electrodeposition", *Surface Engineering, 11*, (1995), pp. 75–77.

Tao, J., et al., "Electromigration Characteristics of Copper Interconnects", *IEEE Electron Devices Letters, 14*, (May 1993), pp. 249–251.

Ting, C. H., "Methods and Needs for Low K Material Research", *Materials Research Society Symposium Proceedings, vol. 381*, Low–Dielectric Constant Materials —Synthesis and Applications in Microelectronics, Lu, T.M., et al., (eds.), San Francisco, CA,(Apr. 17–19, 1995), pp. 3–17.

Van Vlack, L.H., *Elements of Materials Science*, Addison–Wesley Publishing Co., Inc. Reading, MA,(1959), p. 468.

Wang, X.W., et al., "Highly Reliable Silicon Nitride Thin Films Made by Jet Vapor Deposition", *Japanese Journal of Applied Physics, 34*, (Feb. 1995), pp. 955–958.

Wolf, S., et al., *Silicon Processing for the VLSI Era, vol. 1 —Process Technology*, Lattice Press, Sunset Beach, CA,(1986), pp. 514–538.

* cited by examiner

METHODS AND APPARATUS FOR MAKING INTEGRATED-CIRCUIT WIRING FROM COPPER, SILVER, GOLD, AND OTHER METALS

CROSS-REFERENCE TO RELATED APPLICATION(S)

This patent application is a division of U.S. Pat. No. 09/488,098, filed on Jan. 18, 2000, now U.S. Pat. No. 6,429,120 the specification of which is hereby incorporated by reference.

TECHNICAL FIELD

The present invention concerns methods of semiconductor device or integrated circuit manufacturing, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together with aluminum wires to define a specific electric circuit, such as a computer memory.

To form the aluminum wires, fabricators sometimes use a dual-damascene metallization technique, which takes its name from the ancient Damascan metalworking art of inlaying metal in grooves or channels to form ornamental patterns. The dual-damascene technique entails covering the components on a wafer with an insulative layer of silicon dioxide, etching small holes in the insulative layer to expose portions of the components underneath, and subsequently etching shallow trenches from hole to hole to define a wiring pattern. Fabricators then blanket the entire insulative layer with a thin sheet of aluminum and polish off the excess, leaving behind aluminum vias, or contact plugs, in the holes and thin aluminum wires in the trenches. The aluminum wires are typically about one micron thick, or about 100 times thinner than a human hair.

In recent years, researchers have begun using copper instead of aluminum to form integrated-circuit wiring, because copper offers lower electrical resistance and better reliability at smaller dimensions. See, for example, D. Edelstein et al., Full Copper Wiring in a Sub-0.25 um CMOS ULSI Technology, Technical Digest of 1997 IEDM, p. 773–776, 1997; and S. Venkatesan et al., A High Performance 1.8V, 0.20 um CMOS Technology with Copper Metallization, Technical Digest of 1997 IEDM, p. 769–772, 1997. Moreover, Applied Materials, Inc., a maker of semiconductor fabrication equipment, reports special equipment for fabricating copper-wired integrated circuits. (Applied Materials Announces First Barrier/Seed Layer System for Copper Interconnects, http://www.appliedmaterials.com/newsroonm/pr-00103.html, Dec. 2, 1997.)

These copper-wired integrated circuits typically follow a variation of the dual-damascene method, which entails forming a copper-diffusion barrier in holes and trenches prior to filling them with copper. The typical copper-diffusion barrier is more than 30-nanometers thick and consists of tantalum (Ta), tantalum nitride (TaN), tantalum silicon nitride (TaSiN), titanium nitride (TiN), or tungsten nitride (WN). Filling the barrier-lined holes and trenches with copper generally entails forming a thin copper seed layer on the copper-diffusion barrier and then electroplating copper on the seed layer to finish.

The present inventors identified at least two problems with current techniques for making the copper wiring. The first is that typical copper-diffusion barriers add appreciable resistance to the copper wiring, and thus negate some of the advantages of using copper. The second concerns the use of separate wafer-processing chambers to form the copper-diffusion barrier and the copper seed layer. Using two chambers means that wafers are processed in one chamber to form the diffusion barrier and then transported to another chamber to form the seed layer. However, moving wafers from one chamber to another not only slows down fabrication, but also risks the addition of undesirable particles to the wafers, some of which can cause defects in resulting integrated circuits.

Accordingly, there is a need for better ways of making copper wiring in integrated circuits.

SUMMARY OF THE INVENTION

To address these and other needs, the inventors devised unique wafer-processing chambers and methods of forming barrier and seed layers. One embodiment of the wafer-processing chamber includes equipment for physical vapor deposition and equipment for chemical vapor deposition, two processes which facilitate formation of copper-diffusion barriers and seed layers within the chamber. One of the unique methods of forming barrier and seed layers entails forming a graded composition of tungsten silicide ($WSi_x$), nitriding the graded composition, and then depositing a copper seed layer on the nitrided composition, all within a single wafer-processing chamber to promote fabrication efficiency and reduce defects.

DESCRIPTION OF THE PREFERRED EMBODIMENTS

The following detailed description, which references and incorporates FIGS. 1–6, describes and illustrates specific embodiments of the invention. These embodiments, offered not to limit but only to exemplify and teach the concepts of the invention, are shown and described in sufficient detail to enable those skilled in the art to implement or practice the invention. Thus, where appropriate to avoid obscuring the invention, the description may omit certain information known to those of skill in the art.

Figure 1:
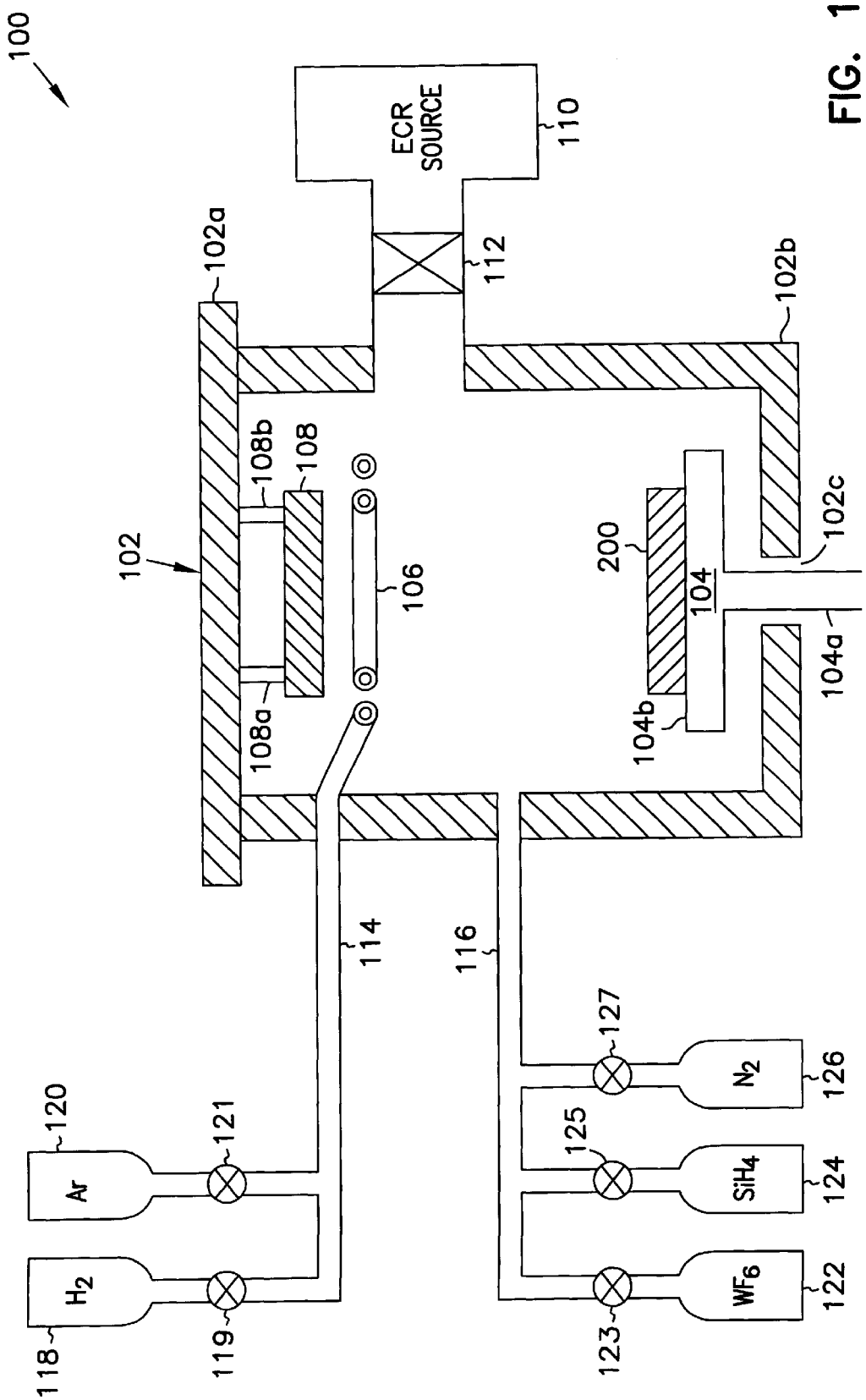
FIG. 1 is a schematic side-view of an exemplary wafer-processing chamber 100 in accord with the present invention.

FIG. 1 shows an exemplary wafer-processing apparatus or system 100 which incorporates teachings of the present invention. In particular, system 100 includes a chamber 102, a wafer holder 104, an RF-gas-emission coil 106, a sputter target 108, an electron-cylotron-resonance (ECR) source 110, an isolation valve 112, gas inlets 114 and 116, gas (or more generally fluid) sources 118, 120, 122, 124, and 126, and mass-flow controllers 119, 121, 123, 125, and 127.

More particularly, chamber 102 includes respective top and bottom plates 102a and 102b. In the exemplary embodiment, chamber 102 is a cylindrical structure formed of stainless steel or glass. However, other embodiments use different structures and materials. Bottom plate 102b includes an opening 102c which is coupled to a vacuum pump (not shown). Extending through opening 102c is a stem portion 104a of wafer holder 104.

Wafer holder 104 also includes a support platform 104b which supports one or more wafers or integrated-circuit assemblies 200. Holder 104 is coupled through opening 102c to a power supply (not shown.) In the exemplary embodiment, wafer holder 104, which is rotatable either manually or automatically, includes internal heating elements (not shown) for heating wafers or assemblies 200 to a desired temperature. In some embodiments, wafer holder 104 is a planetary wafer holder.

Above wafer holder 104 is RF-gas-emission coil 106, which includes one or more turns or loops of electrically conductive tubing. Coil 106, which is selectively couplable to a power supply (not shown), also includes a number of orifices (not shown) for emitting gas toward sputter target 108 or to a position where sputter target 108 is to be installed.

In the exemplary embodiment, the coil turns define a horizontal spiral; however, in other embodiments, the turns define a helical or vertical spiral. Other embodiments use horizontal or vertical spirals with the coils having regular or irregular polygonal forms. The exemplary embodiment constructs coil 106 as two turns of 6.5-millimeter-diameter tubing, with the "diameter" of the turns being greater than the width or diameter of wafer 200. However, other embodiments tubing with regular or irregular polygonal cross-sections, for example, triangular, square, or elliptical. The exemplary orifices have a common diameter of 50 microns and are spaced about two-to-three centimeters apart along the turns of the coil. The diameter of the entire coil is generally large enough to encircle wafer holder 104; however, some embodiments use smaller or larger coils. Also, the exemplary coil 106 consists of the same material as sputter target 108.

Sputter target 108, which is positioned above coil 106, is fixed to top plate 102a via target holders 108a and 108b. Target 108 consists of a material intended for deposition on wafer 200. The exemplary embodiment implements target 108 as a slab of copper with a circular or rectangular shape. However, the invention is not limited to any type, form, or shape of target material. In some embodiments, target 108 is coupled to a power supply (not shown), which biases it to a specific voltage level, for example, a positive, negative, or ground voltage.

In addition to chamber 102, wafer holder 104, RF-gas-emission coil 106, and sputter target 108, wafer-processing apparatus 100 also includes ECR source 110, isolation valve 112, gas inlets 114 and 116, gas sources 118–126, and mass-flow controllers 119–127. ECR source 110 is selectively isolatable from the interior of chamber 102 using isolation valve 112. When isolation value 112 is open, ECR source 110 can inject a high-energy plasma into chamber 102. Isolation value 112 may assume any suitable manual or motor-actuated form, such as gate valve, butterfly valve, etc.

Gas sources 118–126 are coupled respectively via mass-flow controllers 119–127 to one of gas inlets 114 and 116. More particularly, sources 118 and 120 are coupled via respective controllers 119 and 121 to inlet 114. Inlet 114 is coupled to coil 106. Sources 122, 124, and 126 are coupled via respective controllers 123, 125, and 127 to inlet 116.

The exemplary mass-flow controllers are thermal or pressure based; however, the invention is not limited to any particular number or type of mass-flow controller. Additionally, in the exemplary embodiment, gas source 118 supplies hydrogen ($H_2$) gas; source 120 supplies argon (Ar) gas; source 122 supplies tungsten hexaflouride ($WF_6$) gas; source 124 supplies silane ($SiH_4$) gas; and source 126 supplies nitrogen ($N_2$) gas. However, the invention is not limited to any particular number or set of gas sources.

In general operation, apparatus 100 functions, via manual or automatic control, to apply material through physical or chemical vapor deposition onto wafer 200. During physical vapor deposition (PVD) (more commonly known as sputtering), isolation valve 112 is open, enabling ions from ECR source 110 into the chamber. In turn, these ions dislodge matter from sputter target 108 onto wafer 200. During chemical vapor deposition, valve 112 is closed and gases from one or more of the gases sources, for example, $WF_6$ and $SiH_4$, are introduced into the chamber to chemically react and deposit a precipitant on wafers 200. Additionally, to avoid contaminating sputter target 108 during this operation, coil 106 rapidly emits through its orifices a gas, for example hydrogen gas on sputter target 108. The gas sweeps the surface of sputter target 108, preventing its contamination during the chemical-vapor deposition (CVD.) As a further or alternative anti-contamination measure, some embodiments bias sputter target 108 to a low voltage.

Figure 2:
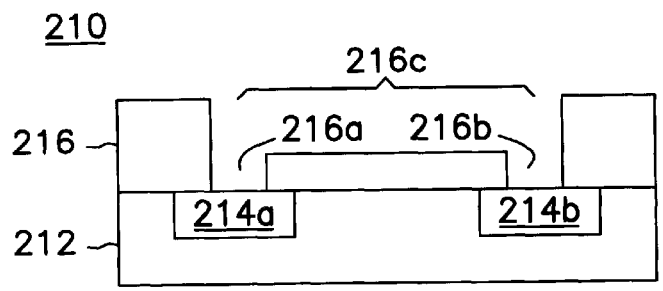
FIG. 2 is a cross-sectional view of an exemplary integrated-circuit assembly 210, including two transistors 214a and 214b and an insulative layer 216 with via holes 216a and 216b, and a trench 216c.

More particularly, FIGS. 2–5 show several partial cross-sectional views of wafer 200, which taken collectively and sequentially, illustrate a unique exemplary method of using apparatus 100 to form diffusion-barrier and seed layers, useful in forming copper, silver, or gold interconnects. The method, as shown in FIG. 2, begins with a known integrated-circuit assembly or structure 210, which can be within any integrated circuit, a dynamic-random-access memory, for example. Assembly 210 includes a substrate 212.

The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.

Figure 3:
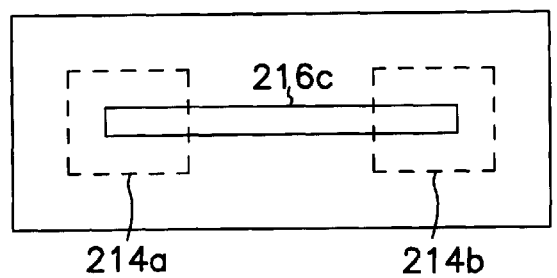
FIG. 3 is a top view of the FIG. 2 assembly, showing relative position of trench 216c and transistors 214a and 214b.

Substrate 212 supports a number of integrated elements 214, for example transistors 214a and 214b. Transistors 214a and 214b are covered by an insulative layer 216, which, for example comprises silicon oxide, nitride, oxynitride, and polymeric materials. Layer 216 includes two exemplary via holes 216a and 216b positioned over respective transistors 214a and 214b and a trench 216c connecting the via holes. FIG. 3 shows a top view of the assembly, further illustrating the relative position of the trench and via holes relative the transistors.

The exemplary embodiment forms layer 216 using deposition, lithographic, and selective-material-removal techniques, such as reactive-ion etching. In the exemplary embodiment, via holes 216a and 216b are cylindrical with diameters of about 1000 nanometers and depths of about 500 nanometers. Trench 216c is less than 0.50 microns wide and at least one micron deep. The invention, however, is not limited to any particular insulative composition(s) or hole and trench dimensions.

Figure 4:
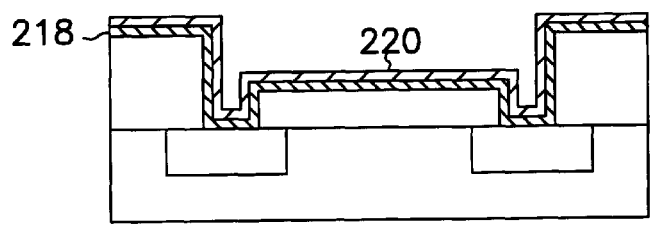
FIG. 4 is a cross-sectional view of the FIG. 2 assembly after formation of diffusion barrier 218 and a seed layer 220.

Next, as shown in FIG. 4, the exemplary method forms a two-to-six-nanometer-thick diffusion barrier 218 over layer 216 within holes 216a, 216b, and trench 216c, more precisely on the floor and sidewalls of these structures. In the exemplary embodiment, forming the diffusion barrier entails inserting wafer 200 into chamber 102 of apparatus 100 and using the apparatus in a CVD mode to form a graded composition of tungsten silicide ($WSi_x$), with x varying from 2.0 to 2.5. This entails heating wafer 200 to a temperature of 360° C. and introducing hydrogen, tungsten hexafluoride, and silane gases into chamber 102 using respective mass-flow controllers 119, 123, and 125.

The exemplary embodiment introduces the hydrogen and tungsten hexaflouride gases about one-to-three seconds before introducing the silane gas and stops introducing the silane gas about one-to-three seconds before stopping introduction of the hydrogen and tungsten hexaflouride. Note that the exemplary embodiment introduces hydrogen through coil 106, for example at 1000 sccm milligrams per second or cubic centimeters per second, to prevent contamination of sputter target 108. Exemplary flow rates for the silane and tungsten hexaflouride gases are respectively 1000 sccm and 14 sccm. These flow rates result in a composition of $WSi_{2.3}$, with a growth rate of approximately 50 nanometers per minute.

To complete the diffusion barrier, the exemplary method nitrides the graded composition of $WSi_x$, forming $WSi_xN_y$. The exemplary nitridation uses apparatus 100 in a PVD mode, following an ECR plasma nitridation procedure. One version of this method is described in A. Hirata et al., WSiN Diffusion Barrier Formed by ECR Plasma Nitridation for Copper Damascene Interconnection, Extended Abstracts of 1998 International Conference on Solid State Devices and Materials, p. 260–261, which is incorporated herein by reference. This entails operating mass-flow controller 121 to introduce argon gas through coil 106 into chamber 102 and thereby excite plasma generated via ECR source 110 and the introduction of nitrogen gas through inlet 116, using mass-flow controller 127. In the exemplary embodiment, the WSiN is not a compound-forming barrier, but a stuffed barrier, which prevents diffusion by stuffing nitrogen atoms into diffusion paths, such as interstitial sites, within the tungsten silicide.

FIG. 4 shows that after forming diffusion barrier 218, the exemplary method forms a seed layer 220 of, for example, copper-, silver-, or gold-based material on top of the diffusion barrier. (As used herein, copper-, silver-, or gold-based material includes any material comprising a substantial amount of copper, silver, or gold. For example, materials containing ten or more percent (by weight) of copper, silver, or gold constitute a copper, silver, or gold-based material.) The exemplary method uses a chemical-vapor-deposition, ionized-sputtering, or DC-magnetron self-sputtering technique to form the seed layer within chamber 102, thereby forming seed layer 220 within chamber 102 avoids the delay and contamination risk of conventional practices which transport the wafer from the chamber used for barrier formation to a separate chamber for seed-layer formation.

The exemplary chemical-vapor-deposition technique follows a procedure such as that described in Y. Senzaki, "Chemical Vapor Deposition of Copper Using a New Liquid Precursor with Improved Thermal Stability," MRS Conference Proceedings of Advanced Metallization and Interconnect Systems for ULSI Applications in 1997, ULSI XIII, P. 451–455, 1998, which is incorporated herein by reference. This procedure yields copper films at a typical deposition rate of 150–170 nanometers per minute at wafer temperatures of 195–225° C. The resistance of these films falls in the range of 2.0 micro-ohm-centimeter after annealing at 400° C. for about five minutes.

In the exemplary embodiment, the ionized sputtering technique and DC magnetron sputtering techniques follow procedures similar to those outlined in S. M. Rossnagel et al., Metal Ion Deposition from Ionized Magnetron Sputtering Discharge," J. Vac. Sci. Technology B, 12(1), p. 449–453, 1994. And Z. J Radzimski et al, "Directional Copper Deposition using D-C Magnetron Self-sputtering," J. Vac. Sci Technology B 16(3), p. 1102–1106, 1998. Exemplary conditions for the ionized-magnetron sputtering include target power range of 10–30 kilowatts for a 200–300 millimeter diameter wafer (or integrated-circuit assembly), RF coil power of 3–5 kilowatts, negative DC bias of 100–200 volts, sputtering argon gas pressurized at 1–35 millitorrs. Ionized-magnetron sputtering, which provides greater acceleration of the metal deposition material than conventional sputtering, forces the metal to more closely conform to the interior profiles of holes and trenches and thus facilitates formation of a conductive structure with less electrical resistance.

Figure 5:
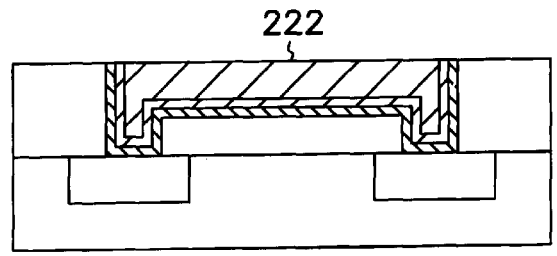
FIG. 5 is a cross-sectional view of the FIG. 4 assembly after formation of a conductive structure 222 on seed layer 220.

After completion of seed layer 220, the exemplary method removes wafer 200 from chamber 102 and completes filling the holes and trenches with a conductive material, for example, a copper-, silver-, or gold-based material, as indicated in FIG. 5. (Some embodiments use a different materials for the seed layer and the subsequent conductive fill material.) The exemplary method completes the filling through electroplating of copper onto the seed layer. Mechanical, chemical, or chemical-mechanical planarization then removes any excess metal, ensuring a substantially planar surface for formation of subsequent metallization levels according to the same or alternative procedures.

Figure 6:
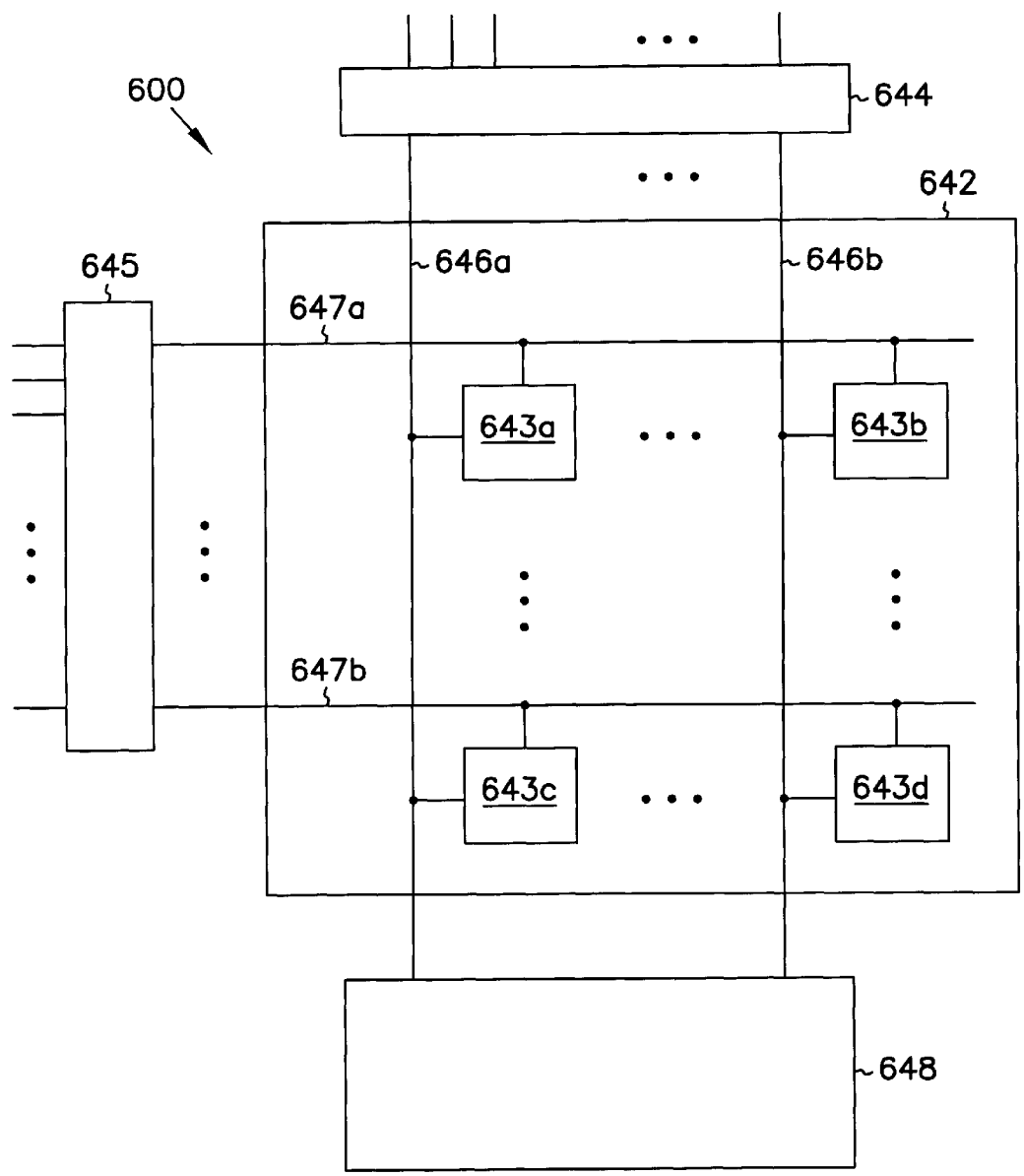
FIG. 6 is a block diagram of an exemplary integrated memory circuit which incorporates the present invention.

FIG. 6 shows one example of the unlimited number of applications for the interconnections of the present invention: a generic integrated memory circuit 600. Circuit 600, which operates according to well-known and understood principles, is generally coupled to a processor (not shown) to form a computer system. More precisely, circuit 600 includes a memory array 642 which comprises a number of memory cells 643a–643d, a column address decoder 644, and a row address decoder 645, bit lines 646, word lines 647, and voltage-sense-amplifier circuit 648 coupled to bit lines 646.

In the exemplary embodiment, each of the memory cells, the address decoders, and the amplifier circuit includes one or more copper-, silver-, or gold-based conductors according to the present invention. Other embodiments, use conductors of other materials, made in accord with methods of the present invention In addition, connections between the address decoders, the memory array, the amplifier circuit are implemented using similar interconnects.

Conclusion

In furtherance of the art, the inventors have presented an apparatus and a method for making diffusion barriers and seed layers in a single processing chamber. The exemplary apparatus includes a wafer-processing chamber having equipment for chemical-vapor deposition and physical vapor deposition, while the exemplary method uses this chamber in a chemical-vapor-deposition mode to form a diffusion barrier and in a physical-vapor deposition mode to form a seed layer. Forming the diffusion barrier and seed layer in a single chamber not only skips the conventional step of transporting the wafer from one chamber to another to form the seed layer, but also avoids the attendant risk of contamination during transport.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. An integrated circuit comprising:
    a layer including one or more transistors;
    an insulative layer overlying the layer and having one or more conductive structures, with each conductive structure electrically coupled to one or more of the transistors and comprising:
        a layer comprising tungsten, silicon, and nitrogen; and
        a layer comprising a silver- or gold-based material.

2. An integrated circuit comprising:
    a layer including one or more transistors;
    an insulative layer overlying the layer and having one or more conductive structures, with each conductive structure electrically coupled to one or more of the transistors and comprising:
        a layer comprising tungsten, silicon, and nitrogen; and
        a layer comprising a silver-based material.

3. An integrated circuit comprising:
    a layer including one or more transistors;
    an insulative layer overlying the layer and having one or more conductive structures, with each conductive structure electrically coupled to one or more of the transistors and comprising:
        a layer comprising tungsten, silicon, and nitrogen; and
        a layer comprising a gold-based material.

4. The integrated circuit of claim 1, wherein the layer comprising tungsten, silicon, and nitride comprises a layer of tungsten silicide having interstitial sites stuffed with nitrogen atoms.

5. The integrated circuit of claim 1, further comprising two or more memory cells.

6. The integrated circuit of claim 2, further comprising two or more memory cells.

7. The integrated circuit of claim 2, wherein the layer comprising tungsten, silicon, and nitride comprises a layer of tungsten silicide having interstitial sites stuffed with nitrogen atoms.

8. The integrated circuit of claim 3, wherein the layer comprising tungsten, silicon, and nitride comprises a layer of tungsten silicide having interstitial sites stuffed with nitrogen atoms.

9. The integrated circuit of claim 3, further comprising two or more memory cells.

10. An integrated circuit comprising
    a layer including one or more transistors;
    an insulative layer overlying the layer and having one or more conductive structures, with each conductive structure electrically coupled to one or more of the transistors and comprising:
        a layer comprising tungsten, silicon, and nitrogen; and
        a layer comprising a silver- or gold-based material, with the layer comprising tungsten, silicon, and nitrogen between the layer comprising a silver- or gold-based material and the insulative layer.

11. The integrated circuit of claim 10, further comprising two or more memory cells.

12. The integrated circuit of claim 10, wherein the layer comprising tungsten, silicon, and nitride comprises a layer of tungsten silicide having interstitial sites stuffed with nitrogen atoms.

13. An integrated circuit comprising
    a layer including one or more transistors;
    an insulative layer overlying the layer and having one or more conductive structures, with each conductive structure electrically coupled to one or more of the transistors and comprising:
        a layer comprising tungsten, silicon, and nitrogen, wherein the layer comprising tungsten, silicon, and nitrogen comprises a graded composition of tungsten silicide; and
        a layer comprising a silver- or gold-based material.

14. The integrated circuit of claim 13, further comprising two or more memory cells.

15. The integrated circuit of claim 13, wherein the layer comprising tungsten, silicon, and nitride comprises a layer of tungsten silicide having interstitial sites stuffed with nitrogen atoms.

16. An integrated circuit comprising
    a layer including one or more transistors;
    an insulative layer overlying the layer and having one or more conductive structures, with each conductive structure electrically coupled to one or more of the transistors and comprising:
        a layer comprising tungsten, silicon, and nitrogen, wherein the layer comprising tungsten, silicon, and nitrogen comprises a graded composition of $WSi_x$, with x varying from 2.0 to 2.5; and
        a layer comprising a silver- or gold-based material.

17. The integrated circuit of claim 16, further comprising two or more memory cells.

18. The integrated circuit of claim 16, wherein the layer comprising tungsten, silicon, and nitride comprises a layer of tungsten silicide having interstitial sites stuffed with nitrogen atoms.

19. An integrated circuit comprising
    a layer including one or more transistors;
    an insulative layer overlying the layer and having one or more conductive structures, with each conductive structure electrically coupled to one or more of the transistors and comprising:
        a layer comprising tungsten, silicon, and nitrogen, wherein the layer comprising tungsten, silicon, and nitrogen comprises a graded composition of $WSi_x$, with x varying from 2.0 to 2.5, wherein the layer comprising tungsten, silicon, and nitride comprises a layer of tungsten silicide having interstitial sites stuffed with nitrogen atoms; and
        a layer comprising a silver- or gold-based material.

20. The integrated circuit of claim 19, further comprising two or more memory cells.

21. An integrated circuit comprising:
    a layer including one or more transistors;
    an insulative layer overlying the layer and having one or more conductive structures, with each conductive structure electrically coupled to one or more of the transistors and comprising:

a layer comprising tungsten, silicon, and nitrogen; and a layer comprising a silver-based material, with the layer comprising tungsten, silicon, and nitrgen between the layer comprising a silver-based material and the insulative layer.

22. The integrated circuit of claim 21, further comprising two or more memory cells.

23. The integrated circuit of claim 21, wherein the layer comprising tungsten, silicon, and nitride comprises a layer of tungsten silicide having interstitial sites stuffed with nitrogen atoms.

24. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen, wherein the layer comprising tungsten, silicon, and nitrogen comprises a graded composition of tungsten silicide; and
 a layer comprising a silver-based material.

25. The integrated circuit of claim 24, wherein the layer comprising tungsten, silicon, and nitride comprises a layer of tungsten silicide having interstitial sites stuffed with nitrogen atoms.

26. The integrated circuit of claim 24, further comprising two or more memory cells.

27. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen, wherein the layer comprising tungsten, silicon, and nitrogen comprises a graded composition of $WSi_x$, with x varying from 2.0 to 2.5; and
 a layer comprising a silver-based material.

28. The integrated circuit of claim 27, wherein the layer comprising tungsten, silicon, and nitride comprises a layer of tungsten silicide having interstitial sites stuffed with nitrogen atoms.

29. The integrated circuit of claim 27, further comprising two or more memory cells.

30. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen, wherein the layer comprising tungsten, silicon, and nitrogen comprises a graded composition of $WSi_x$, with x varying from 2.0 to 2.5, wherein the layer comprising tungsten, silicon, and nitride comprises a layer of tungsten silicide having interstitial sites stuffed with nitrogen atoms; and
a layer comprising a silver-based material.

31. The integrated circuit of claim 30, further comprising two or more memory cells.

32. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen; and
 a layer comprising a gold-based material, with the layer comprising tungsten, silicon, and nitrogen between the layer comprising a gold-based material and the insulative layer.

33. The integrated circuit of claim 32, further comprising two or more memory cells.

34. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen, wherein the layer comprising tungsten, silicon, and nitrogen comprises a graded composition of tungsten silicide; and
 a layer comprising a gold-based material.

35. The integrated circuit of claim 34, further comprising two or more memory cells.

36. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen, wherein the layer comprising tungsten, silicon, and nitrogen comprises a graded composition of $WSi_x$, with x varying from 2.0 to 2.5; and
 a layer comprising a gold-based material.

37. The integrated circuit of claim 36, further comprising two or more memory cells.

38. An integrated circuit comprising:

a layer including one or more transistors;

an insulative layer overlying the layer and having one or more conductive structures, with each conductive structure electrically coupled to one or more of the transistors and comprising:
 a layer comprising tungsten, silicon, and nitrogen, wherein the layer comprising tungsten, silicon, and nitrogen comprises a graded composition of $WSi_x$, with x varying from 2.0 to 2.5, wherein the layer comprising tungsten, silicon, and nitride comprises a layer of tungsten silicide having interstitial sites stuffed with nitrogen atoms; and
 a layer comprising a gold-based material.

39. The integrated circuit of claim 38, further comprising two or more memory cells.

* * * * *

UNITED STATES PATENT AND TRADEMARK OFFICE
CERTIFICATE OF CORRECTION

PATENT NO. : 6,756,298 B2
DATED : June 29, 2004
INVENTOR(S) : Ahn et al.

It is certified that error appears in the above-identified patent and that said Letters Patent is hereby corrected as shown below:

Title page,
Item [56], References Cited, U.S. PATENT DOCUMENTS, after "M' Saad" insert -- et al. --.
OTHER PUBLICATIONS, "*In: Metals Handbook, Ninth Edition, vol. 2,*" reference, delete "Nonferrus" and insert -- Nonferrous --, therefor.

Column 1,
Line 62, delete "newsroonm" and insert -- newsroom --, therefor.

Column 9,
Line 3, delete "nitrgen" and insert -- nitrogen --, therefor.

Signed and Sealed this

Twenty-first Day of June, 2005

JON W. DUDAS
*Director of the United States Patent and Trademark Office*